(12) United States Patent
Zhang et al.

(10) Patent No.: US 7,380,231 B2
(45) Date of Patent: May 27, 2008

(54) WIRE SPREADING THROUGH GEOTOPOLOGICAL LAYOUT

(75) Inventors: Shuo Zhang, San Jose, CA (US); Fangyi Luo, Santa Cruz, CA (US)

(73) Assignee: Nannor Technologies, Santa Clara, CA (US)

( * ) Notice: Subject to any disclaimer, the term of this patent is extended or adjusted under 35 U.S.C. 154(b) by 394 days.

(21) Appl. No.: 11/146,485

(22) Filed: Jun. 6, 2005

(65) Prior Publication Data

US 2006/0277517 A1    Dec. 7, 2006

(51) Int. Cl.
*G06F 17/50* (2006.01)
(52) U.S. Cl. .................. 716/12; 716/2; 716/11
(58) Field of Classification Search .............. 716/1, 716/2, 11, 12
See application file for complete search history.

(56) References Cited

U.S. PATENT DOCUMENTS

| | | | |
|---|---|---|---|
| 5,798,937 A | 8/1998 | Bracha et al. ............. | 716/9 |
| 6,026,224 A | 2/2000 | Darden et al. ............. | 716/10 |
| 6,093,214 A | 7/2000 | Dillon ........................ | 716/17 |
| 6,275,971 B1 | 8/2001 | Levy et al. ................. | 716/5 |
| 6,480,995 B1 | 11/2002 | Schmidt et al. ............. | 716/11 |
| 6,484,302 B1 | 11/2002 | Freymuth ................... | 716/10 |
| 6,532,581 B1 | 3/2003 | Toyonaga et al. .......... | 716/11 |
| 6,715,133 B2 | 3/2004 | Brennan ..................... | 716/2 |
| 7,065,729 B1 * | 6/2006 | Chapman .................... | 716/13 |

OTHER PUBLICATIONS

Zhang, S. and Dai, W. "TEG: A New Post-Layout Optimization Method," IEEE Transactions on Computer-Aided Design of Integrated Circuits and Systems, vol. 22, No. 4, Apr. 2003, pp. 1-12.
White Paper: Silicon Design Chain Cooperation Enables Nanometer Chip Design, Published by Cadence Design Systems, Inc. of San Jose, CA, Dec. 2003.
Srinivas Raghvendra, "Redefining Design for Yield," Compiler, Jan. 2004, pp. 1-8 [retrieved on Aug. 13, 2004 from the Internet at <<URL: http: //www.synopsys.com/news/pubs/compiler/art2_redefi-jan04.html>>].
Jim Lipman, "RTL Tools Take Design Planning to a Higher Level," *designfeature RTL Logic*, Aug. 1999, pp. 87-96.
Richard Goering, "Designers put Latest Tools to the Test," *EE Times*, Jul. 2000, pp. 1-4 [Retrieved from the Internet on Sep. 17, 2004 at <<URL: http: //www.eetimes.com/article/showArticle.jhtml?articleId=18304378>>].

* cited by examiner

*Primary Examiner*—Thuan Do
(74) *Attorney, Agent, or Firm*—Lumen Patent Firm, Inc.

(57) ABSTRACT

The present invention provides a layout yield improvement tool that performs wire spreading to optimize integrated circuit (IC) designs in the physical design stage after detail routing. Preferably, the wire spreading is performed on a geotopological layout. Each modifiable wire thereof is processed to generate a geometric bottom-up shape (BUS) and a top-down shape (TDS). The BUS and TDS are merged to form a final geometrical Middle Shape (MS). Each point in the MS has a position is averaged from the positions of the two correlated points in the BUS and TDS. Unnecessary short jogs are removed from the MS of each wire. A final layout is generated by combining all of the final geometric shapes of each wire segments. As such, the wire-to-wire spacing is increased to more than the minimum spacing requirement without causing any design rule violations.

18 Claims, 8 Drawing Sheets
(1 of 8 Drawing Sheet(s) Filed in Color)

FIG. 6A  Original wire segments having topological representations

FIG. 6B  BUSs

FIG. 6C  TDSs

FIG. 6D  BUSs + TDSs

FIG. 6E  Calculated middle paths with short jogs

FIG. 6F  Short jogs removed, showing final geometry shapes with optimized wire spreading Routed layout without wire spreading    Routed layout with wire spreading

FIG. 7

Routed layout without wire spreading

801

Metal fill

Routed layout with wire spreading

803

Metal fill

WIRE SPREADING THROUGH GEOTOPOLOGICAL LAYOUT

CROSS-REFERENCE TO RELATED APPLICATIONS

This application relates to the U.S. patent application Ser. No. 10/946,918, filed Sep. 21, 2004 and entitled, "ROUTED LAYOUT OPTIMIZATION WITH GEOTOPOLOGICAL LAYOUT ENCODING FOR INTEGRATED CIRCUIT DESIGNS," which is incorporated herein by reference in its entirety.

BACKGROUND OF THE INVENTION

1. Field of the Invention

This invention relates generally to automatic layout optimization tools for semiconductor integrated circuit designs. More particularly, it relates to a new physical design tool that is able to increase the spacing between metal wires in the layout effectively and efficiently without violating any design rules.

2. Description of the Related Art

The flow for designing an integrated circuit (IC) can be roughly divided into the logical design phase and the physical design phase. The logical design phase includes several design stages: from the design specification to architectural behavioral design stage, to the register transfer level (RTL) design stage, to the gate design stage, after which the logical IC design is ready for the physical design phase. The physical design phase includes floor planning, placement, and routing, which produces the physical IC design layout.

Today, state-of-the-art integrated circuits usually contain tens of millions of transistors and over a million of metal wires on a single chip. To achieve a dense design, automatic physical design tools use the minimum spacing rules and the minimum width wires. The minimum spacing is usually only $\frac{1}{10}$ micron or less, which is about the same or smaller than the size of dust particles. Consequently, bridging fault is one of the most critical reliability problems responsible for the lower yield in the semiconductor manufacturing process.

Bridging fault happens when the adjacent metal wires are inadvertently and erroneously connected due to dust contamination during the manufacturing process. The entire design could be ruined by a single dust particle lying between two different metal wires. Since the possibility of the dust contamination usually decreases by cubic root as the size of dust increases, even a very small increment on wire-to-wire spacing can remarkably avoid the false connection by the dust. Wire spreading is one of the most effective solutions to reduce bridging fault, hence reduce yield loss.

In addition to reducing dust related yield loss, wire spreading offers many other benefits. One of them is that it reduces the dummy metal fill for layout density control. Uniformed layout metal density is an important requirement for yield in the modern IC manufacture process. Generally, the dummy metal fill is inserted to the low density area in the layout to achieve a similar density as in the high density area. The problem is, the more the amount of metal fill, the more the manufacture variation, the more the possible yield loss.

Wire spreading increases the spacing between wires that originally follow the minimum spacing and, at the same time, decreases the spacing between wires which have more than the minimum spacing. The overall effect to the layout is that the metal density in the high density area is decreased and the metal density in the low density area is increased. The total amount of required dummy metal fill is reduced, so is the related yield loss.

Another benefit is that wire spreading reduces crosstalk noise. By enlarging the spacing between timing critical nets, the design performance can be greatly improved. What is more, the total capacitance of the layout is reduced by wire spreading, so the overall power consumption is reduced, which is welcomed in any designs.

Since wire spreading inevitably changes the wire routing path, the problem remains in how to increase the wire-to-wire spacing without causing any design rule violations.

Due to the nature of routing, the layout routers have to use the minimum spacing rule between wire paths during the routing stage. To fix timing or signal integrity problems, as one of the post-routing optimization, the router could enlarge the spacing between specific net pairs. However, the routers cannot achieve wire spreading which increase the wire-to-wire spacing on any possible nets throughout the whole layout.

Existing wire spreading tools that increase the net-to-net spacing on a routed layout through some automatic layout tool are based on the traditional geometrical layout representation. Since in a geometrical layout the wire path of every net has the determined shape and position, those wire paths imposes geometrical constrains on any modification to the layout. Consequently, to avoid introducing design rule violations, these geometrical layout based wire spreading tools have a limited capability. They usually can only process designs with less than 100K cells and usually take tens of hours or even days to complete the process.

Considering that the minimum size of a routing layout is usually over 1000K cells and that the routing can typically be completed within a few hours, there is a clear need in the art for an automatic layout optimization solution that can provide better and faster wire spreading on the whole layout effectively and efficiently without violating any design rules. The present invention addresses this need.

BRIEF SUMMARY OF THE INVENTION

The present invention provides a new tool that optimizes a routed integrated circuit (IC) layout with wire spreading. Preferably, the wire spreading tool is implemented as a feature of the geotopological layout optimization technology described in the above-referenced co-pending U.S. patent application Ser. No. 10/946,918, although it could be implemented with conventional layout optimization tools that are based on either topology or geometry.

A geotopological layout simultaneously represents unmodifiable nets by geometrical wiring paths and modifiable nets by topological wiring paths. According to the invention, each wire segment is first processed in a bottom-up order, starting from the layout bottom boundary, to generate a corresponding geometrical Bottom Shape (BS). If a wire segment is represented in the geotopological layout by its geometrical path, its BS is exactly the same as its geometrical path. If a wire segment is represented by its topological path, its BS is generated such that there is exactly the minimum spacing between its BS and the BSs of the wire segments below it. The minimum spacing rule is enforced throughout the entire process so that a valid geometrical layout can be generated without creating any spacing violations.

After each wire segment is processed with a geometrical path BS, all wire segments are again processed one by one in the reverse (top-down) order to apply extra spacing, if possible. A new geometrical shape, referred to as the Bottom-Up Shape (BUS), is generated for each wire segment. Again, for a wire segment having a geometrical representation in the initial geotopological layout, its BUS is the same as its BS. For a wire segment having a topological representation, its BUS is generated by moving up its BS to reach the minimum spacing with the BUSs of the wire segments above and then moving it down for extra spacing if possible.

According to the invention, the wire segments are processed one by one in a top-down order and a corresponding geometrical Top Shape (TS) is generated for each of the wire segments. The TS of a wire segment having a geometrical representation is the same as its geometrical path. The TS of a wire segment having a topological representation is generated so that there is exactly the minimum spacing between its TS and the TSs of the wire segments above this segment.

The wire segments are again processed one by one in the reverse (bottom-up) order and a new geometrical Top-Down Shape (TDS) is generated correspondingly for each of the wire segments to apply extra spacing, if possible. The TDS of a wire segment having a geometrical representation initially is the same as its TS or geometrical path. For a wire segment having a topological representation initially, its TDS is generated by moving down its TS to reach the minimum spacing with the TDSs of the wire segments below and then moving it up for extra spacing if possible.

For each wire segment, its BUS and TDS are merged to form a final geometrical Middle Shape (MS). Each point in the MS has a position that is averaged from the positions of the two correlated points in the BUS and TDS. Next, unnecessary short jogs are removed from the MS of each wire segment. A final geometry layout with optimal wire spreading can then be generated by combining all of the final geometric shapes of each wire segments. During the whole process of generating this new geometry layout with optimal wire spreading, there is not a single design rule violation.

The wire spreading according to the invention advantageously reduces particle related yield loss, reduces crosstalk noises, reduces metal fills, and reduces the total power consumption. Other objects and advantages of the present invention will become apparent to one skilled in the art upon reading and understanding the preferred embodiments described below with reference to the following drawings.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF THE INVENTION

In the following detailed description, like numbers/characters may be used to refer to identical, corresponding, or similar items in different figures.

The present invention provides a computer-implemented layout optimization tool with an innovative wire spreading tool useful in reducing yield loss, crosstalk, metal fill, power consumption, among others. Based on a preferred geotopological layout optimization flow, this invention increases wire-to-wire spacing in a post-routing layout, effectively achieving full layout wire spreading without creating any design rule violations in the layout.

The geotopological layout optimization flow has many advantages over geometry-based and topology-based methods of layout optimization flow. As an example, a conventional layout optimization flow generally follows a topological approach in which a topological layout is first extracted from a geometrical layout. Specified layout modifications, such as wiring sizing and spacing or rip-up and reroute, are then performed on the topological layout according to desired optimization targets. A topological design rule checker and a design rule violation solver ensure the modified topological layout represent a valid geometrical layout. The modified topological layout is converted back into a geometrical layout and the geometrical wire paths are regenerated according to their topologies.

The topological layout extracted from the geometrical layout only captures the relative positions and connections of layout elements, and contains no geometry information of wires. A wire in the topological layout is represented as spatial relationships with respect to other layout elements.

Although this topology-based approach provides much more flexibility in modifying routed layout than geometry-based methods, a critical problem exists. After a routed layout is processed, even without any modification on the topological layout, the regenerated geometrical layout can still be different from the original geometrical layout. The inconsistency is due to the nature of the topological representation. That is, one topological layout represents a set of multiple geometrical layouts.

Another problem is that the topological optimization flow could change the wire path or the wire length of the timing critical nets, resulting in the timing change of these nets. Since timing is one of the most critical requirements and the design timing margin is getting smaller and smaller because of the increasing clock speed, any small change in these timing critical nets could cause timing violation and design failure.

In addition to the timing critical nets, certain nets, for example, the nets connected to the input and output pins, should not be affected by wire path changes. Although the number of these non-modifiable nets is relatively small compared to the total number of nets in the design, it is impossible to keep these nets intact throughout the design flow. This makes the topological approach impractical in the real IC design world.

According to the geotopological approach described in the above-referenced co-pending U.S. patent application Ser. No. 10/946,918, a routed layout with geometrical wiring paths is transformed into a geotopological layout where some nets are represented by their determined geometrical wiring paths and some by their respective wiring topology at the same time. All layout modifications are then performed according to the geotopological layout. An embedded design rule checker ensures the validity thereof. Finally, a new geometrical layout is regenerated accordingly, including all the layout changes for the targeted optimization. This geotopological approach enables an IC designer to modify a routed layout for various optimization targets, while advantageously maintaining the exact routing paths of critical nets that are not modifiable.

Figure 1:
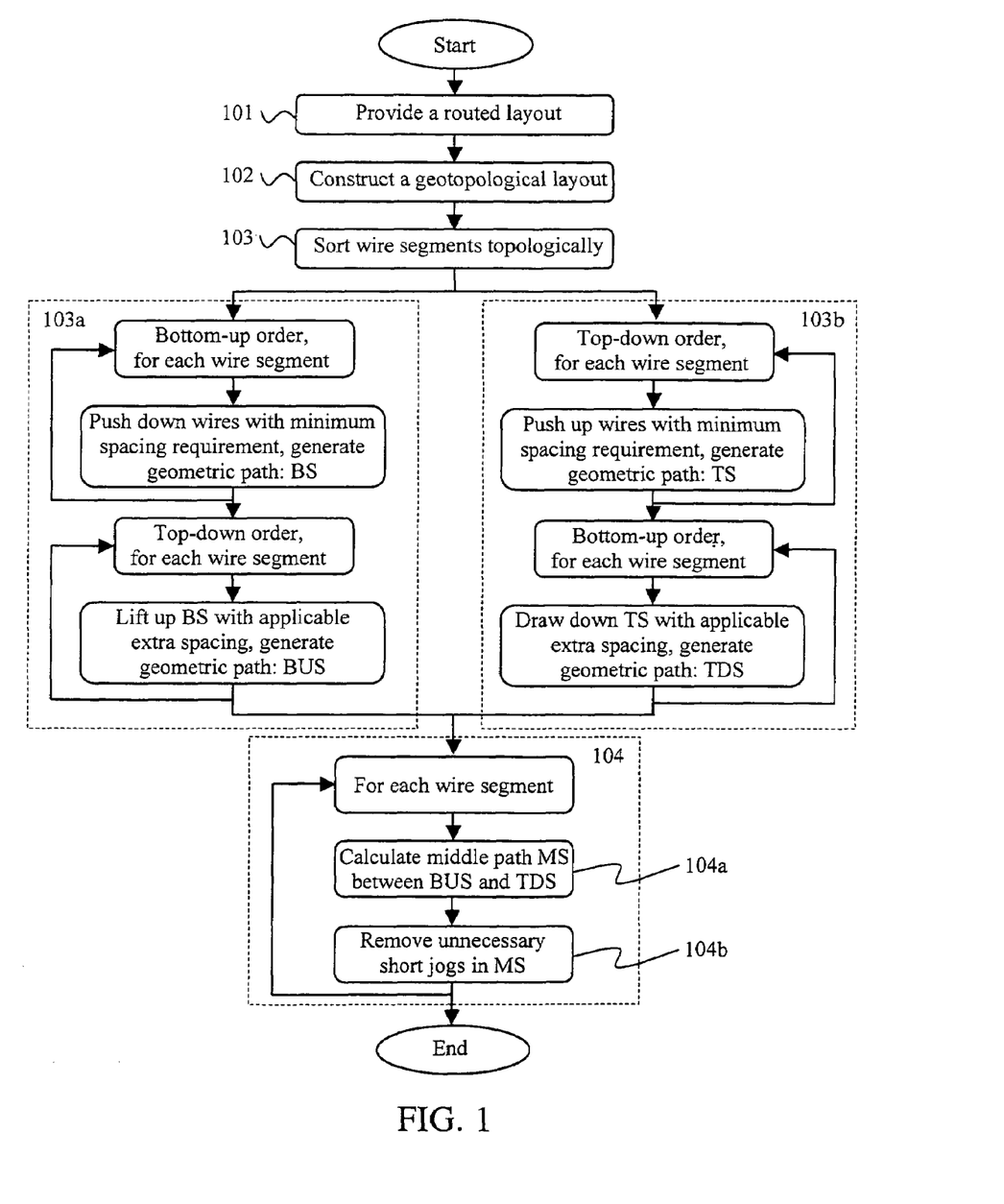
FIG. 1 illustrates a wire spreading flow based on the geotopological approach, according to an aspect of the present invention.
Figure 2:
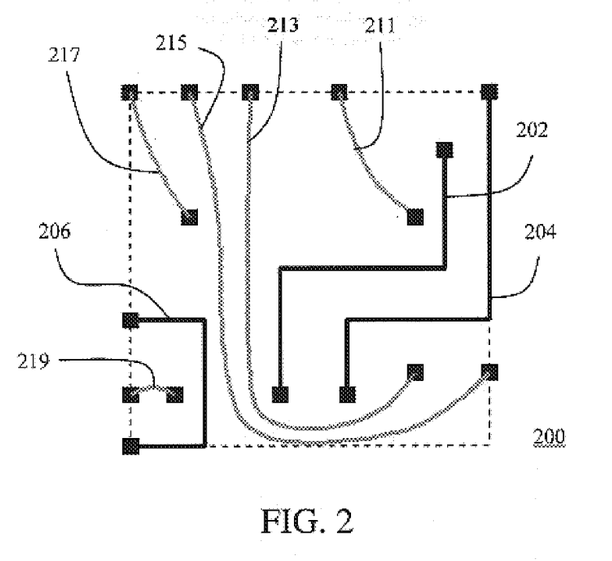
FIG. 2 illustrates an exemplary geotopological layout.

FIG. 1 illustrates the new wire spreading flow based on this geotopological approach. According to the invention, the flow starts with a routed layout in step 101. In the routed layout, the routing of some nets is not modifiable due to the timing result or other design constraints. From the routed layout and with the routing information, a geotopological layout is constructed in step 102. FIG. 2 illustrates an exemplary geotopological layout 200 in which unmodifiable nets are represented as geometrical wiring paths (solid lines) 202-206, while modifiable nets are represented as topological wiring paths (shaded lines) 211-219. The geotopological layout (i.e., the modifiable nets or wire segments) is then modified in step 103 to obtain enlarged, optimized wire-to-wire spacing.

Step 103 includes two branches—step 103a and step 103b. The two branches merge before step 104, which uses outputs from both branches. In step 103a, wire segments are processed one by one in a bottom-up order, which means that each wire segment is processed after the wire segments below it had been processed in the layout.

Figure 3:
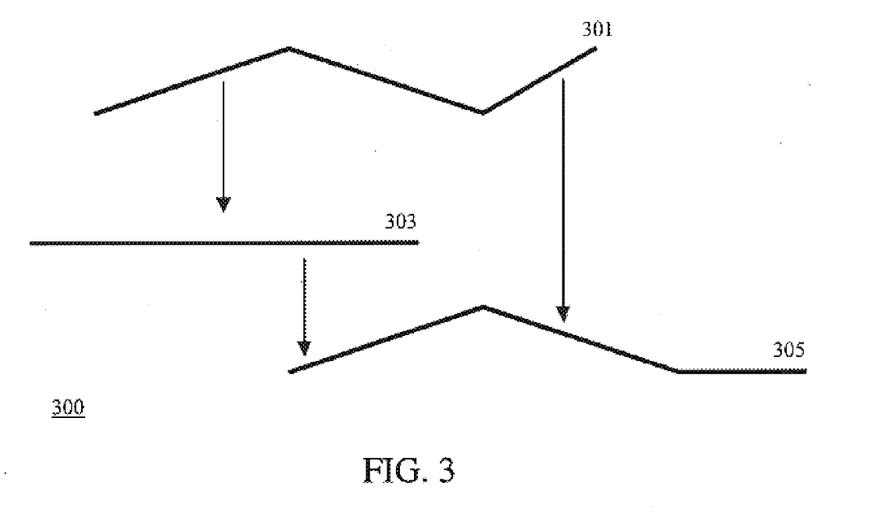
FIG. 3 illustrates the relationship between wire segments.

FIG. 3 illustrates the relationship between three wire segments. In this example, a wire segment 303 is below a wire segment 301 and a wire segment 305 is below both the wire segment 303 and the wire segment 301.

Figure 4:
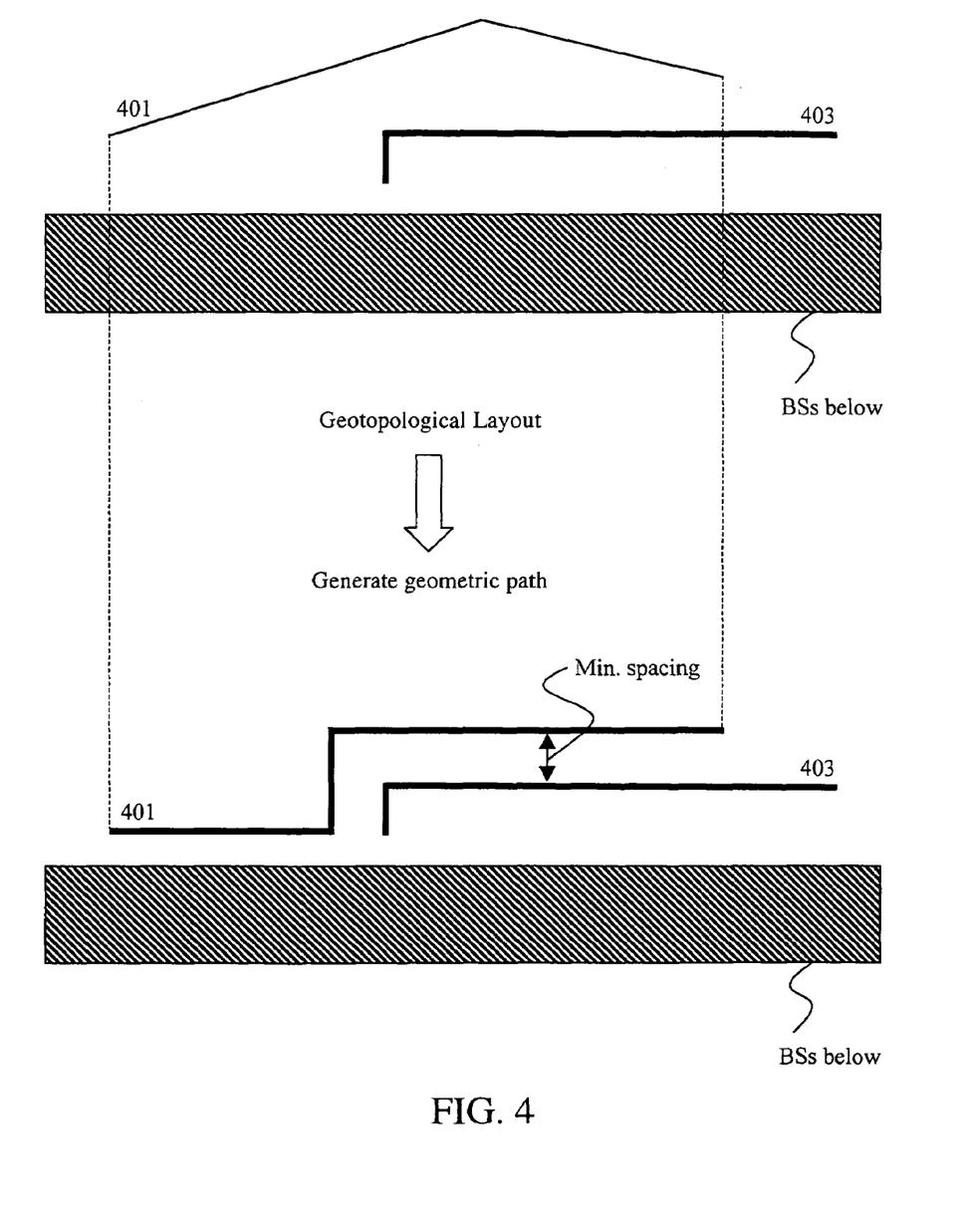
FIG. 4 illustrates how bottom shapes (BSs) of wire segments are generated.

Referring to FIG. 4, starting from the layout bottom boundary, each wire segment is pushed down with a geometrical Bottom Shape (BS). If a wire segment is represented in the geotopological layout by its geometrical path, its BS in step 103a is exactly the same as its geometrical path. If a wire segment is represented by its topological path, its BS is generated such that there is exactly the minimum spacing between its BS and the BSs of the wire segments below it. In this example, a wire segment 403 is represented geometrically and a wire segment 401 is represented topologically in the geotopological layout. In step 103a, The wire segment 403 is pushed down with a geometrical BS that is the same as its geometrical path in the geotopological layout, as shown in FIG. 4. The wire segment 401 is pushed down with a geometrical BS that follows the minimum spacing requirement. The minimum spacing rule is enforced throughout the entire step 103a so that a valid geometrical layout can be generated without creating any spacing violations.

Referring back to FIG. 1, after each wire segment is processed with geometrical path BS, each wire segment is again processed one by one in the reverse (top-down) order to apply extra spacing if possible. A new geometrical shape, referred to as the Bottom-Up Shape (BUS), is generated for each wire segment. For a wire segment having a geometrical representation in the initial geotopological layout, its BUS is the same as its BS. For a wire segment having a topological representation, its BUS is generated by moving up its BS to reach the minimum spacing with the BUSs of the wire segments above and then moving it down for extra spacing if possible.

Figure 5A:
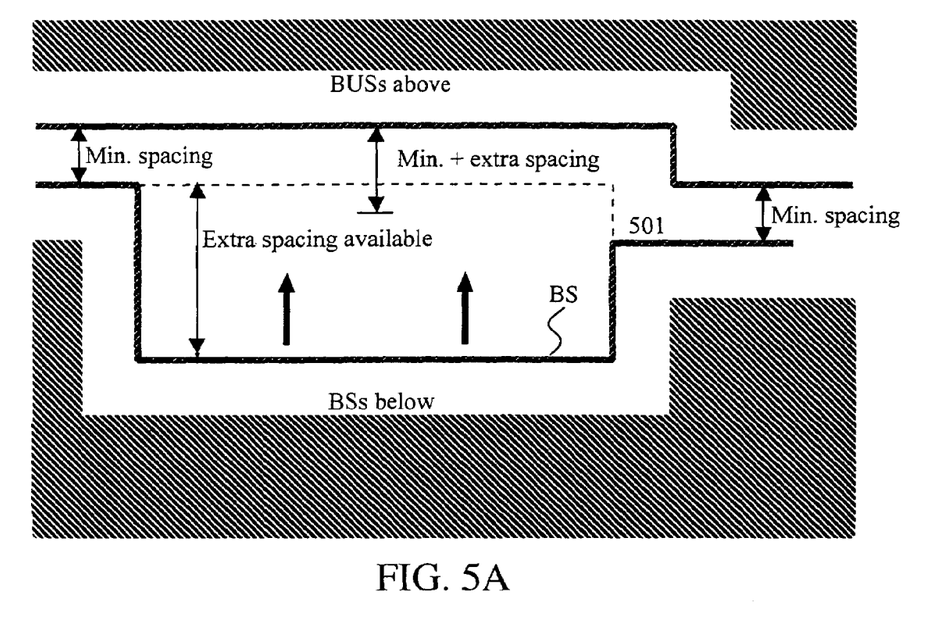
FIGS. 5A-5B illustrate how a BUS of a wire segment is generated base on its BS.
Figure 5B:
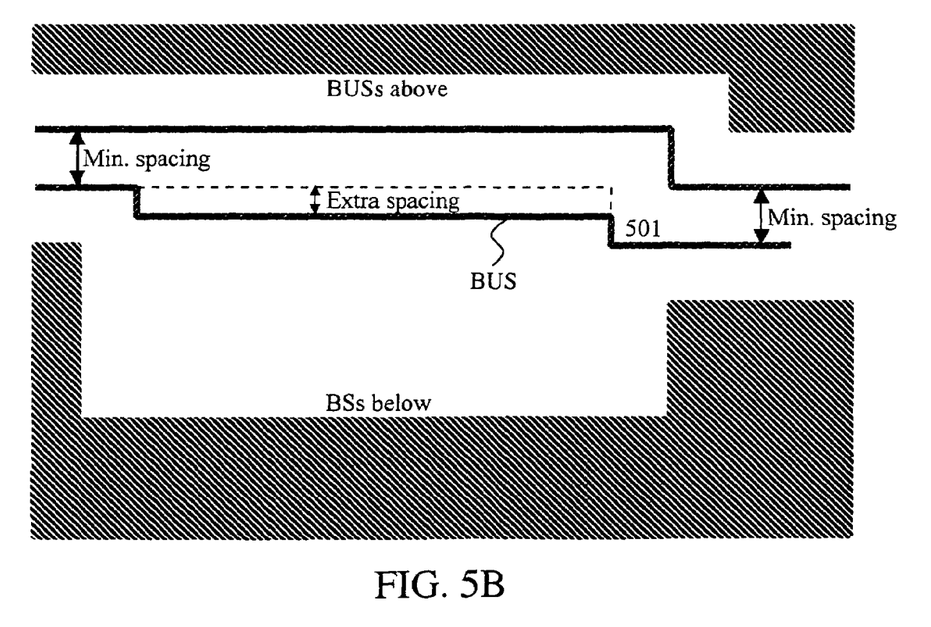

FIGS. 5A-5B illustrate how a BUS of a wire segment 501 is generated base on its BS. First, as shown in FIG. 5A, every part of its BS is lifted up as much as possible to form the potential BUS (represented by the dashed line) so that there is only the required minimum spacing between this BUS and other BUSs of wire segments above the wire segment 501. Then, a determination is made to check whether there is extra spacing available between this potential BUS and its BS. If so, a portion of the BUS is lowered, increasing the spacing thereof to more than the minimum, as shown in FIG. 5B.

Step 103b of FIG. 1 is similar to step 103a, except that each wire segment is first processed in a top-down order and a geometrical Top Shape (TS) is generated for each wire segment. The TS of a wire segment having a geometrical representation in step 102 is the same as its geometrical path. The TS of a wire segment having a topological representation is generated so that there is exactly the minimum spacing between its TS and the TSs of the wire segments above this segment.

Similarly, each wire segment is again processed in the reverse (bottom up) order and a new geometrical Top-Down Shape (TDS) is generated therefor. The TDS of a wire segment having a geometrical representation in the initial geotopological layout is the same as its TS or geometrical path. For a wire segment having a topological representation initially, its TDS is generated by moving down its TS to reach the minimum spacing with the TDSs of the wire segments below and then moving it up for extra spacing if possible.

Figure 6A:
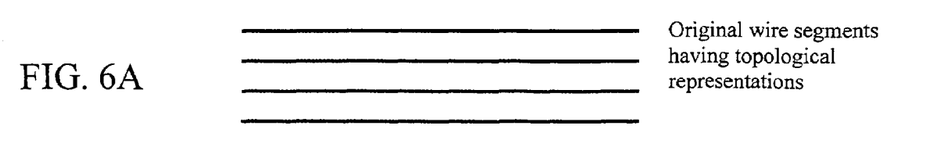
FIGS. 6A-6F together give an example of optimal wire spreading according to an aspect of the present invention.
Figure 6B:
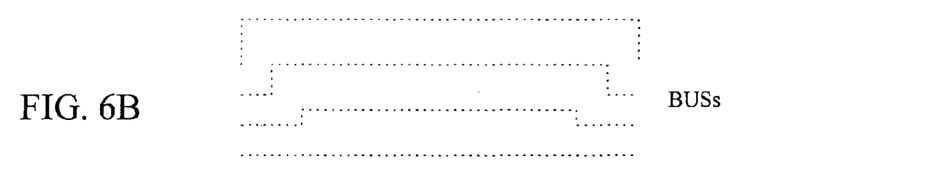
Figure 6C:
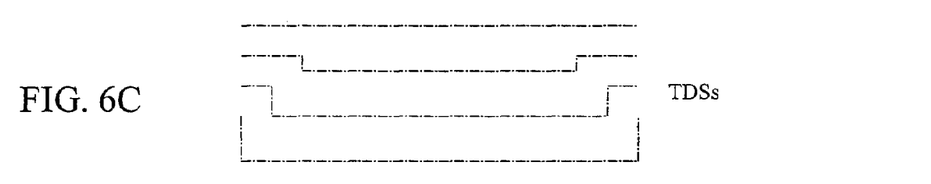

FIGS. 6A-6F together give an example of optimal wire spreading according to an aspect of the present invention. FIG. 6A shows four parallel wires, which are all represented by topological paths and have only the minimum spacing between them. FIG. 6B shows the BUSs generated by step 103a of FIG. 1 and FIG. 6C shows the TDSs generated by step 103b of FIG. 1.

Figure 6D:
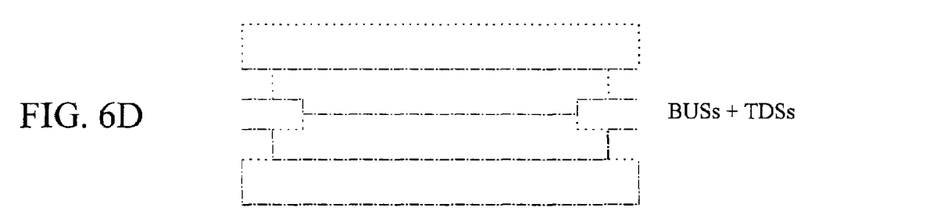
Figure 6E:
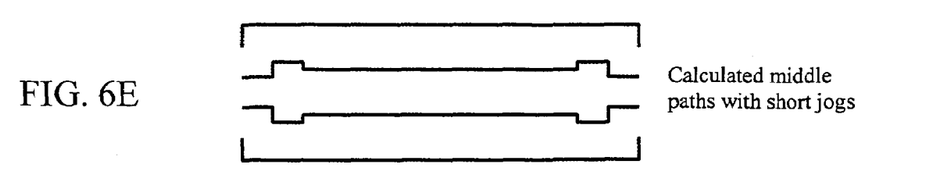

In step 104 of FIG. 1, for each wire segment, its BUS and TDS are merged to form a final geometrical Middle Shape (MS) in step 104a. As illustrated in FIGS. 6D-6E, each point in the MS (FIG. 6E) has a position that is averaged from the positions of the two correlated points in the BUS and TDS (FIG. 6D).

Figure 6F:
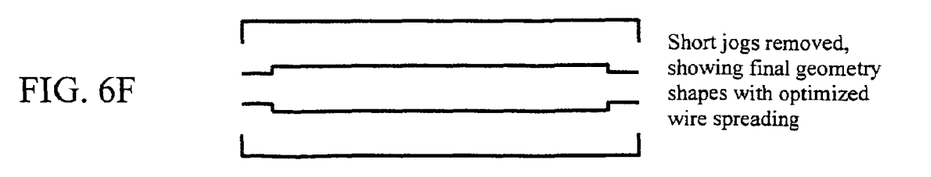

In step 104a, unnecessary short jogs are removed from the MS of each wire segment, as shown in FIG. 6F. A final geometry layout with optimal wire spreading can then be generated by combining all of the final geometry shapes of each wire segments. During the whole process of generating this new geometry layout with optimal wire spreading, there is not a single design rule violation.

Figure 7:
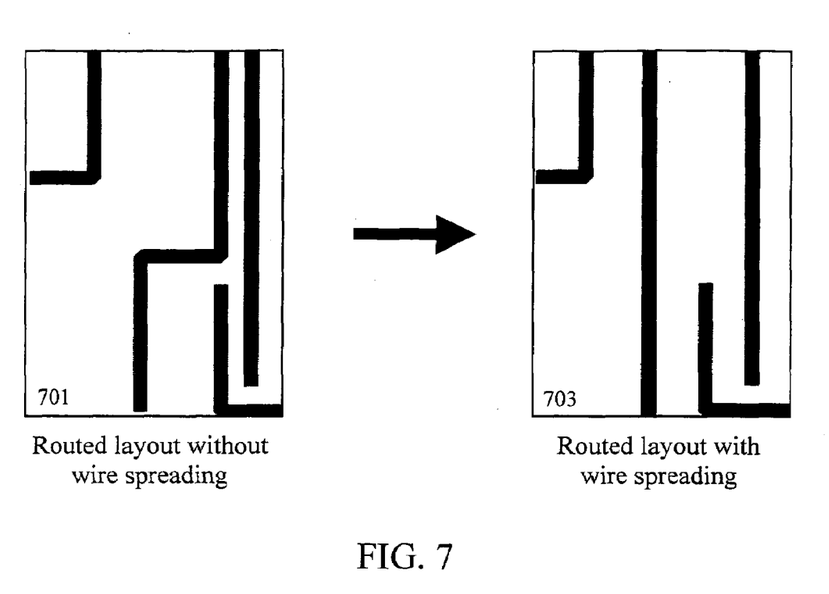
FIG. 7 compares a routed layout without wire spreading with a routed layout with wire spreading.
Figure 8:
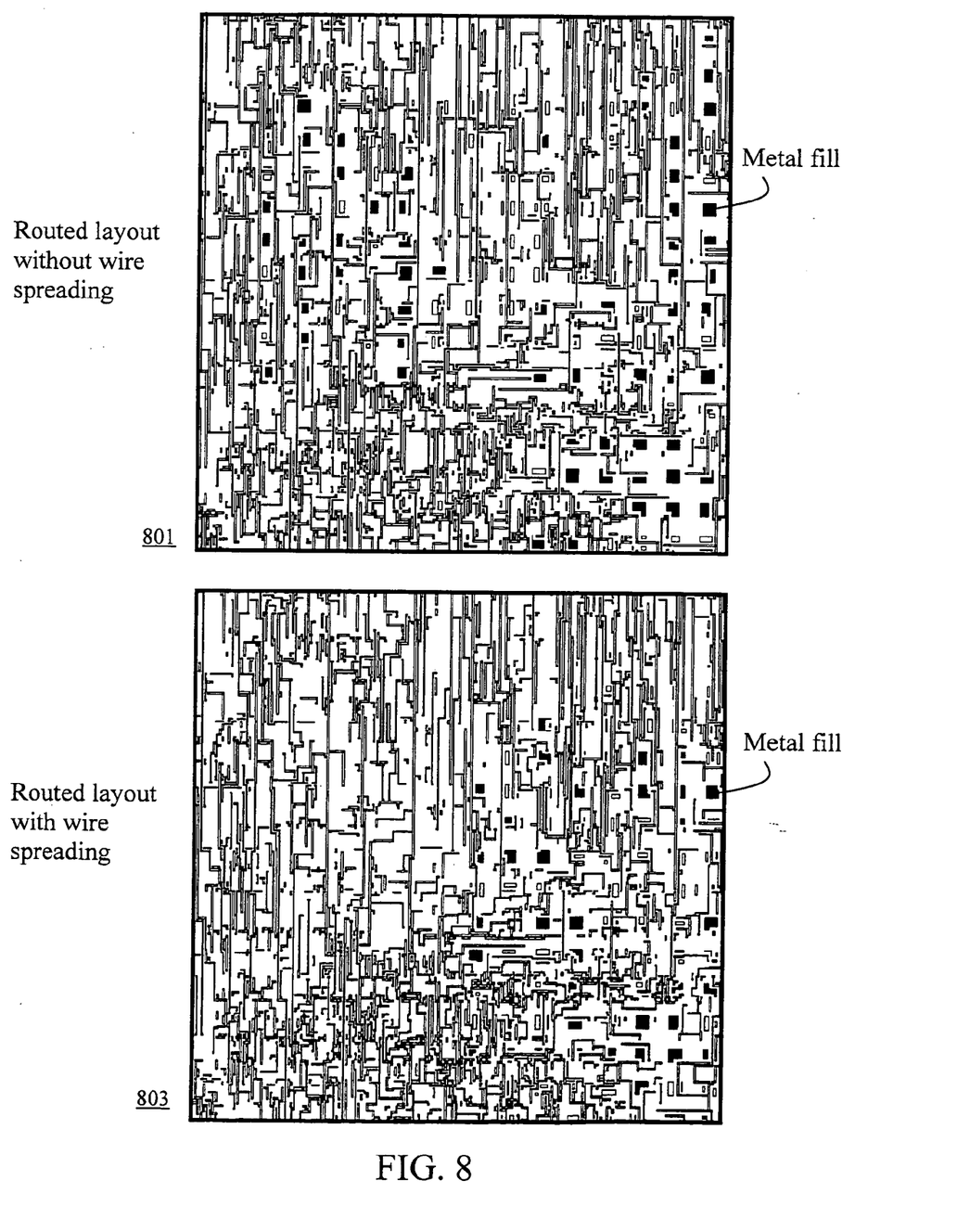
FIG. 8 demonstrates that the wire spreading according to the invention advantageously reduces metal fill for density control.

FIG. 7 compares a routed layout 701 with another layout 703 optimized with wire spreading according to the present invention. The advantages of wire spreading are numerous—it reduces particle related yield loss, reduces crosstalk noise, and reduces the total layout capacitance, hence reducing the total power consumption. Moreover, as demonstrated in FIG. 8, it reduces metal fill for density control, comparing a routed layout 801 without wire spreading and an optimized layout 803 with wire spreading according to the present invention.

Figure 9:
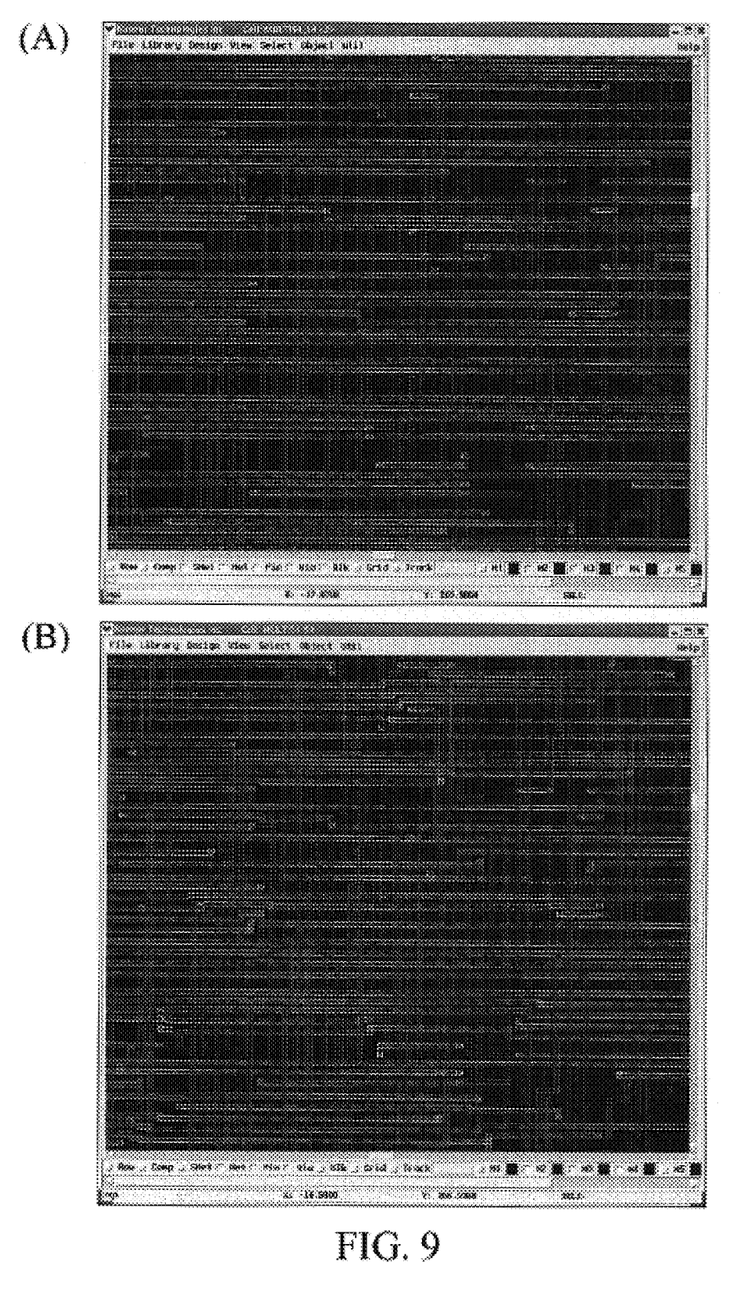
FIG. 9 shows intricate details of a routed layout before (A) and after (B) wire spreading.

FIG. 9 shows actual screenshots of a routed layout before (A) and after (B) wire spreading. The original layout has about four million gates. The total turn-around time for processing this layout from (A) to (B) is about 160 minutes or about two and a half hours, with a single 2.66 GHz Pentium® IV processor and 2360 MB peak memory. The reduction in processing time, and hence cost and labor, is another significant advantage of the present invention, making it a viable and practical solution to IC layout design optimization flows.

As one skilled in the art will appreciate, most digital computer systems can be programmed to implement the present invention. To the extent that a particular computer system configuration is programmed to implement the present invention, it becomes a digital computer system within the scope and spirit of the present invention. That is, once a digital computer system is programmed to perform particular functions pursuant to computer-executable instructions from program software that implements the invention described heretofore, it in effect becomes a special purpose computer particular to the present invention. The necessary programming-related techniques are well known to those skilled in the art and thus are not further described herein for the sake of brevity.

Computer programs implementing the invention described herein can be distributed to users on a computer-readable medium such as floppy disk, memory module, or CD-ROM and are often copied onto a hard disk or other storage medium. When such a program of instructions is to be executed, it is usually loaded either from the distribution medium, the hard disk, or other storage medium into the random access memory of the computer, thereby configuring the computer to act in accordance with the invention disclosed herein. All these operations are well known to those skilled in the art and thus are not further described herein. The term "computer-readable medium" encompasses distribution media, intermediate storage media, execution memory of a computer, and any other medium or device capable of storing for later reading by a computer a computer program implementing the invention disclosed herein.

Although the present invention and its advantages have been described in detail, it should be understood that the present invention is not limited to or defined by what is shown or described herein. As one of ordinary skill in the art will appreciate, various changes, substitutions, and alterations could be made or otherwise implemented without departing from the principles of the present invention. For example, it is possible that a new layout can be generated based on a conventional, pure topological layout or geometrical layout, so long as that it can supply the required information to enable the above-described wire spreading.

Accordingly, the scope of the present invention should be determined by the following claims and their legal equivalents.

What is claimed is:

1. A method of altering wire spacing of a routed layout of an integrated circuit design, said method comprising:
   providing a routed layout having a plurality of wire segments, wherein each said wire segment can have a geometrical representation or a topological representation in said routed layout;
   for each of said wire segments,
   generating a bottom-up shape (BUS) and a top-down shape (TDS) by altering positions of wire segments having topological representations in said routed layout;
   wherein said BUS for each of said wire segments is generated by determining a bottom shape (BS) for each of said wire segments and then increasing spacing between said bottom shapes of said wire segments;
   wherein said TDS for each of said wire segments is generated by determining a top shape (TS) for each of said wire segments and then increasing spacing between said top shapes of said wire segments;
   merging said BUS and said TDS to form a final middle shape (MS); and
   removing unnecessary short jogs from said MS.

2. The method of claim 1, further comprising:
   generating a final geometry layout by combining all MSs of said wire segments.

3. The method of claim 1, wherein
   each point in said MS has a position that is averaged from positions of two correlated points in said BUS and said TDS.

4. The method of claim 1, wherein
   said wire segments contain modifiable wire segments and unmodifiable wire segments.

5. The method of claim 4, wherein
   said modifiable wire segments are represented topologically in said routed layout; and
   said unmodifiable wire segments are represented geometrically in said routed layout.

6. The method of claim 1, wherein said determining a bottom shape (BS) for each of said wire segments comprises:
   processing said wire segments one by one in a bottom-up order, starting from a bottom boundary of said routed layout; and
   generating a corresponding geometrical bottom shape (BS) for each of said wire segments;
   wherein if a wire segment is represented in said routed layout by its geometrical path, its BS is identical to its geometrical path; and
   wherein if a wire segment is represented in said routed layout by its topological path, its BS is generated in conformity with the minimum spacing requirement between its BS and BSs of wire segments below it.

7. The method of claim 6, wherein said increasing spacing between said bottom shapes of said wire segments comprises:
   processing said wire segments one by one in a top-down order; and
   for each of said wire segments, generating said BUS;
   wherein if a wire segment is represented in said routed layout by its geometrical path, its BUS is identical to its BS; and
   wherein if a wire segment is represented in said routed layout by its topological path, its BUS is generated by moving up its BS to reach the minimum spacing with BUSs of wire segments above it and then moving it down for applicable extra spacing.

8. The method of claim 1, wherein said determining a top shape (TS) for each of said wire segments comprises:
   processing said wire segments one by one in a topdown order, starting from a top boundary of said routed layout; and
   generating a corresponding geometrical top shape (TS) for each of said wire segments;
   wherein if a wire segment is represented in said routed layout by its geometrical path, its TS is identical to its geometrical path; and
   wherein if a wire segment is represented in said routed layout by its topological path, its TS is generated in conformity with the minimum spacing requirement between its TS and TSs of wire segments above it.

9. The method of claim 8, wherein said increasing spacing between said top shapes of said wire segments comprises:
   processing said wire segments one by one in a bottom up order; and for each of said wire segments, generating said TDS;
wherein if a wire segment is represented in said routed layout by its geometrical path, its TDS is identical to its TS; and
wherein if a wire segment is represented in said routed layout by its topological path, its TDS is generated by moving down its TS to reach the minimum spacing with TDSs of wire segments below it and then moving it up for applicable extra spacing.

10. A computer-readable medium storing a computer program implementing the method steps of claim 1.

11. A computer system programmed to perform the method steps of claim 1.

12. A method of altering wire spacing of a routed layout of an integrated circuit design, wherein said routed layout has a plurality of wire segments and wherein said wire segments comprise modifiable wire segments and unmodifiable wire segments, said method comprising:
constructing a geotopological layout of said routed layout;
wherein said modifiable wire segments are represented topologically in said geotopological layout; and
wherein said unmodifiable wire segments are represented geometrically in said geotopological layout;
for each of said wire segments,
generating a bottom-up shape (BUS) and a top-down shape (TDS) by altering positions of wire segments having topological representations in said routed layout;
wherein said BUS for each of said wire segments is generated by determining a bottom shape (BS) for each of said wire segments and then increasing spacing between said bottom shapes of said wire segments;
wherein said TDS for each of said wire segments is generated by determining a top shape (TS) for each of said wire segments and then increasing spacing between said top shapes of said wire segments;
merging said BUS and said TDS to form a final middle shape (MS); and
removing unnecessary short jogs from said MS; and
generating a final geometry layout by combining all MSs of said wire segments;
wherein each point in said MS has a position that is averaged from positions of two correlated points in said BUS and said TDS.

13. A computer-readable medium storing a computer program implementing the method steps of claim 12.

14. The computer-readable medium of claim 13, further comprising:
code for generating a corresponding geometrical bottom shape (BS) and said BUS for each of said wire segments; wherein
if a wire segment is represented in said routed layout by its geometrical path, its BS is identical to its geometrical path;
if a wire segment is represented in said routed layout by its topological path, its BS is generated in conformity with the minimum spacing requirement between its BS and BSs of wire segments below it;
if a wire segment is represented in said routed layout by its geometrical path, its BUS is identical to its BS; and
if a wire segment is represented in said routed layout by its topological path, its BUS is generated by moving up its BS to reach the minimum spacing with BUSs of wires segments above it and then moving it down for applicable extra spacing.

15. The computer-readable medium of claim 13, further comprising:
code for generating a corresponding geometrical top shape (TS) and said TDS for each of said wire segments; wherein
if a wire segment is represented in said routed layout by its geometrical path, its TS is identical to its geometrical path;
if a wire segment is represented in said routed layout by its topological path, its TS is generated in conformity with the minimum spacing requirement between its TS and TSs of wire segments above it;
if a wire segment is represented in said routed layout by its geometrical path, its TDS is identical to its TS; and
if a wire segment is represented in said routed layout by its topological path, its TDS is generated by moving down its TS to reach the minimum spacing with TDSs of wire segments below it and then moving it up for applicable extra spacing.

16. A computer system programmed to perform the method steps of claim 12.

17. The computer system of claim 16, further comprising:
code for generating a corresponding geometrical bottom shape (BS) and said BUS for each of said wire segments; wherein
if a wire segment is represented in said routed layout by its geometrical path, its BS is identical to its geometrical path;
if a wire segment is represented in said routed layout by its topological path, its BS is generated in conformity with the minimum spacing requirement between its BS and BSs of wire segments below it;
if a wire segment is represented in said routed layout by its geometrical path, its BUS is identical to its BS; and
if a wire segment is represented in said routed layout by its topological path, its BUS is generated by moving up its BS to reach the minimum spacing with BUSs of wires segments above it and then moving it down for applicable extra spacing.

18. The computer system of claim 16, further comprising:
code for generating a corresponding geometrical top shape (TS) and said TDS for each of said wire segments; wherein
if a wire segment is represented in said routed layout by its geometrical path, its TS is identical to its geometrical path;
if a wire segment is represented in said routed layout by its topological path, its TS is generated in conformity with the minimum spacing requirement between its TS and TSs of wire segments above it;
if a wire segment is represented in said routed layout by its geometrical path, its TDS is identical to its TS; and
if a wire segment is represented in said routed layout by its topological path, its TDS is generated by moving down its TS to reach the minimum spacing with TDSs of wire segments below it and then moving it up for applicable extra spacing.

* * * * *